(12) United States Patent
Uezato

(10) Patent No.: US 9,712,173 B2
(45) Date of Patent: Jul. 18, 2017

(54) CLOCK SIGNAL STOP DETECTION CIRCUIT

(71) Applicant: Renesas Electronics Corporation, Tokyo (JP)

(72) Inventor: Seima Uezato, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/182,221

(22) Filed: Jun. 14, 2016

(65) Prior Publication Data

US 2017/0041006 A1    Feb. 9, 2017

(30) Foreign Application Priority Data

Aug. 3, 2015  (JP) ................. 2015-153112

(51) Int. Cl.
| | |
|---|---|
| H03K 21/38 | (2006.01) |
| H03K 21/40 | (2006.01) |
| H03K 5/1534 | (2006.01) |
| H03K 3/037 | (2006.01) |
| H03K 19/003 | (2006.01) |
| H03K 19/21 | (2006.01) |
| H02P 31/00 | (2006.01) |

(52) U.S. Cl.
CPC ............ *H03K 21/38* (2013.01); *H02P 31/00* (2013.01); *H03K 3/037* (2013.01); *H03K 5/1534* (2013.01); *H03K 19/003* (2013.01); *H03K 19/21* (2013.01); *H03K 21/40* (2013.01)

(58) Field of Classification Search
CPC ...... H02P 31/00; H03K 3/037; H03K 5/1534; H03K 19/003; H03K 19/21; H03K 21/38; H03K 21/40
USPC ......................... 327/141, 142, 144, 151, 160
See application file for complete search history.

(56) References Cited

U.S. PATENT DOCUMENTS

| | | | | |
|---|---|---|---|---|
| 4,841,167 A | * | 6/1989 | Saegusa ................ | H04L 7/0331 327/160 |
| 2003/0034820 A1 | * | 2/2003 | Starr ........................ | G06F 1/08 327/292 |
| 2009/0304140 A1 | * | 12/2009 | Hsieh ..................... | H03K 21/38 377/107 |
| 2009/0307518 A1 | * | 12/2009 | Hsieh .................... | G04F 10/005 713/501 |
| 2015/0381158 A1 | * | 12/2015 | Li ........................... | H03K 5/19 327/20 |

FOREIGN PATENT DOCUMENTS

JP    9-292928 A    11/1997

\* cited by examiner

*Primary Examiner* — William Hernandez
(74) *Attorney, Agent, or Firm* — McDermott Will & Emery LLP

(57) ABSTRACT

A semiconductor device detects an edge of input data input into a data retention circuit to which a clock signal is supplied, resets a first count value obtained by counting an edge detection frequency with a clock signal, resets a second count value obtained by counting the edge detection frequency with an inverted clock signal, and thereby detects an abnormality of the clock signal in accordance with a situation that either of the first count value and the second count value has reached a value indicative of an overflow state.

10 Claims, 12 Drawing Sheets

CLOCK SIGNAL STOP DETECTION CIRCUIT

CROSS-REFERENCE TO RELATED APPLICATIONS

The disclosure of Japanese Patent Application No. 2015-153112 filed on Aug. 3, 2015 including the specification, drawings and abstract is incorporated herein by reference in its entirety.

BACKGROUND

The present invention relates to semiconductor devices and particularly relates to, for example, a semiconductor device that includes a data retention circuit that retains input data in synchronization with a clock signal.

In recent years, in the field of semiconductor devices, functional safety that safety of a system that the semiconductor device is to be loaded is ensured even when a fault has occurred has been sought for. As one example of the functional safety, a clock safety function of ensuring soundness of the clock signal used in the semiconductor device is given. In the clock safety function, it is requested to monitor a state of the clock signal. Accordingly, one example of a technology of monitoring the state of the clock signal is disclosed in Japanese Unexamined Patent Application No. H09-292928.

A clock signal source monitoring device described in Japanese Unexamined Patent Application No. H09-292928 includes a plurality of clock signal sources and a plurality of counters and gives the clock signals from the first to third clock signal sources to the first to third counters respectively as clear signals. In addition, in the clock signal source monitoring device described in Japanese Unexamined Patent Application No. H09-292928, the clock signal from the first clock signal source is given to the second and third counters as a count input and the clock signal from the second clock signal source is given to the first counter as the count input. Accordingly, in the clock signal source monitoring device described in Japanese Unexamined Patent Application No. H09-292928, when any one of the clock signal sources has gone wrong, a count value is counted up to a set value and therefore an alarm signal is given off. In addition, immediately after a power source has been turned on, the count value is set to a value indicative of an alarm state with a preset signal from a count value setting unit. Since the alarm signal is not lost when the power source is turned on even when the plurality of clock signal sources have gone wrong by doing so, the fault is detected.

SUMMARY

However, in the technology described in Japanese Unexamined Patent Application No. H09-292928, it is requested to provide the plurality of clock signal sources in order to detect an abnormality of the clock signal. Therefore, when the technology described in Japanese Unexamined Patent Application No. H09-292928 is used, such a disadvantage may occur that it is difficult to detect the abnormality of the clock signal in a part to which the clock signal is supplied only by one system.

Other subjects and novel features will become apparent from description of the present specification and the appended drawings.

According to one embodiment of the present invention, there is provided a semiconductor device that detects an edge of input data to be input into a data retention circuit to which the clock signal is supplied, resets a first count value obtained by counting an edge detection frequency with the clock signal, resets a second count value obtained by counting the edge detection frequency with an inverted clock signal, and thereby detects the abnormality of the clock signal in accordance with a situation that either of the first count value and the second count value has reached a value indicative of an overflow state.

According to the above-mentioned one embodiment, it becomes possible for the semiconductor device to detect the abnormality of the clock signal with the clock signal in one system.

DETAILED DESCRIPTION

For clarification of description, the following description and the drawings are appropriately omitted and simplified. In the respective drawings, the same numerals are assigned to the same elements and duplicated description thereon is omitted as demanded.

A semiconductor device 1 according to a first embodiment includes a data retention circuit (for example, a D flip-flop) that retains data in synchronization with a clock signal. In the semiconductor device 1, a synchronous clock signal that has been distributed from the clock signal supplied from a clock signal source is supplied to the data retention circuit. In addition, in the semiconductor device 1 according to the first embodiment, a clock signal stop detection circuit is provided for the data retention circuit and an abnormality of the synchronous clock signal to be supplied to the data retention circuit is detected by the clock signal stop detection circuit. It is preferable that the clock signal stop detection circuit according to the first embodiment be arranged as a clock signal stop detection cell that the data retention circuit and the clock signal stop detection circuit are packed as one circuit cell. It is possible to implement simplification of, for example, a logic design, a timing design, a layout design and so forth by incorporating the clock signal stop detection circuit into the semiconductor device 1 by using the clock signal stop detection cell.

Figure 1:
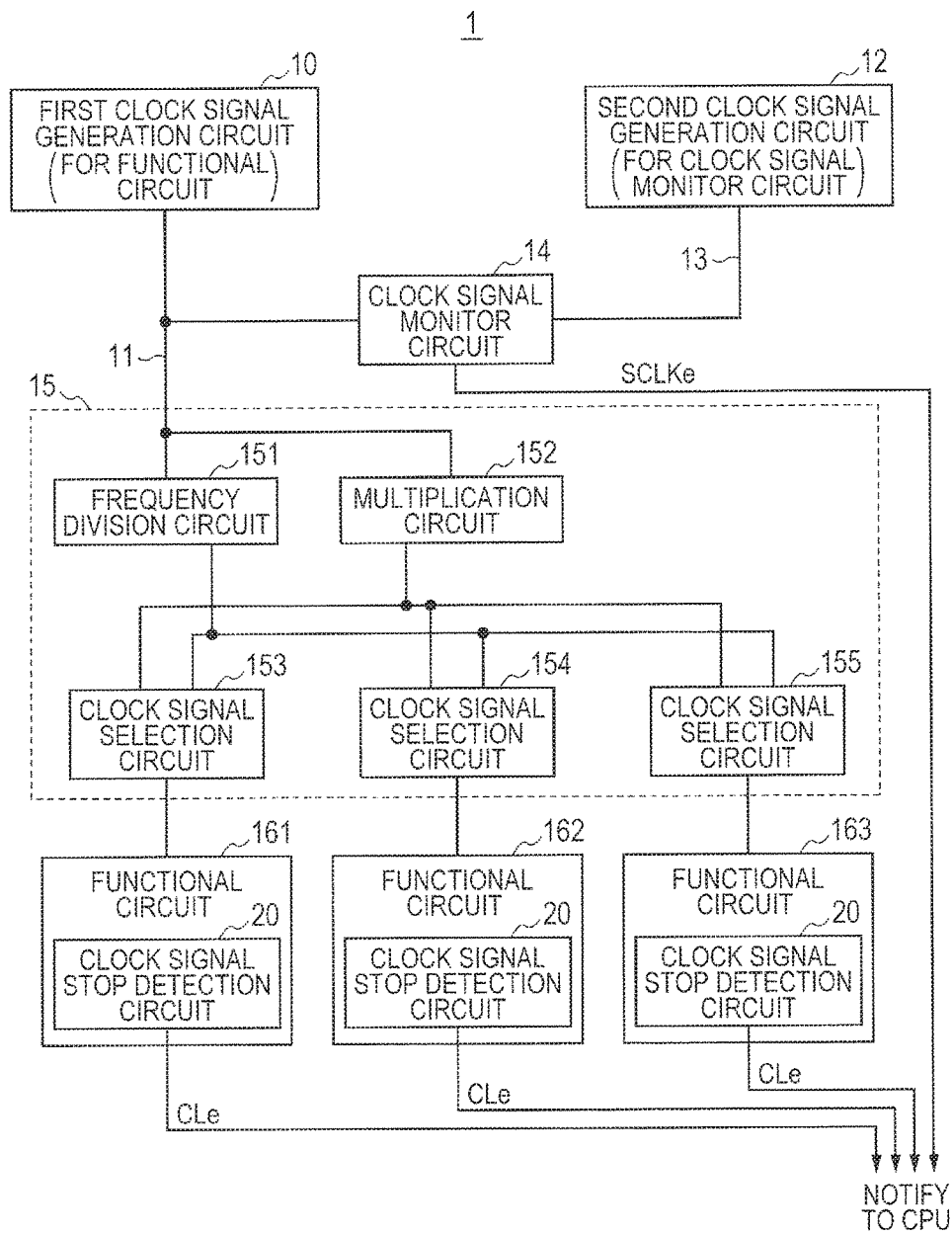
FIG. 1 is a block diagram illustrating one example of a semiconductor device according to a first embodiment of the present invention.

FIG. 1 is a block diagram illustrating one example of the semiconductor device 1 according to the first embodiment. As illustrated in FIG. 1, the semiconductor device 1 according to the first embodiment includes a first clock signal generation circuit 10, a main clock signal wiring 11, a second clock signal generation circuit 12, a sub clock signal wiring 13, a clock signal monitor circuit 14, a clock signal distribution network 15, functional circuits 161 to 163 and so forth. In addition, it is assumed that the semiconductor device 1 illustrated in FIG. 1 also includes an arithmetic operation unit such as, for example, a CPU (Central Processing Unit) and so forth in a host system so as to be controlled by the arithmetic operation unit in issuance of instructions relevant to a timing that switching between a clock signal operating state and a clock signal stopped state is performed, a timing that start-up is begun and so forth.

In addition, although in the example in FIG. 1, the first clock signal generation circuit 10 and the second clock signal generation circuit 12 are illustrated in the semiconductor device 1, it is also possible to configure the first clock signal generation circuit 10 and the second clock signal generation circuit 12 as externally attached units.

The first clock signal generation circuit 10 generates a first clock signal for operating the functional circuits 161 to 163. The main clock signal wiring 11 transmits the first clock signal. The second clock signal generation circuit 12 generates a second clock signal used for operating the clock signal monitor circuit 14. The sub clock signal wiring 13 transmits the second clock signal. The clock signal monitor circuit 14 detects the abnormality of the first clock signal by using the first clock signal and the second clock signal. When the clock signal monitor unit 14 has detected the abnormality of the first clock signal, the clock signal monitor circuit 14 notifies the CPU of the abnormality by sending a main clock error signal SCLKe. The clock signal monitor circuit 14 is a circuit for detecting the abnormality of the clock signal by using the plurality of clock signals.

The clock signal distribution network 15 apportions the first clock signal to a plurality of circuits as synchronous clock signals. In the example illustrated in FIG. 1, the clock signal distribution network 15 includes a frequency division circuit 151, a multiplication circuit 152, clock signal selection circuits 153 to 155 and so forth. Incidentally, the clock signal distribution network 15 may also include a CTS (Clock Tree Synthesis) buffer circuit that regulates a timing that the clock signal reaches the circuit concerned in addition to the block of the above-mentioned circuits or may be configured only by the CTS buffer circuit.

The frequency division circuit 151 generates the synchronous clock signal obtained by subjecting the first clock signal to frequency division. The multiplication circuit 152 generates the synchronous clock signal obtained by subjecting the first clock signal to multiplication. The clock signal selection circuits 153 to 155 each selects either of the synchronous clock signal that the frequency division circuit 151 outputs and the synchronous clock signal that the multiplication circuit 152 outputs and outputs the selected synchronous clock signal to each of the functional circuits 161 to 163.

The functional circuits 161 to 163 are circuits for implementing various functions based on the specifications. The synchronous clock signal that the clock signal selection circuit 153 has selected is supplied to the functional circuit 161. The synchronous clock signal that the clock signal selection circuit 154 has selected is supplied to the functional circuit 162. The synchronous clock signal that the clock signal selection circuit 155 has selected is supplied to the functional circuit 163. Then, each of the functional circuits 161 to 163 includes a clock signal stop detection circuit 20. The clock signal stop detection circuit 20 outputs a clock signal stop detection signal CLe when the synchronous clock signal that is supplied to the corresponding functional circuit has entered a stopped state. The clock signal stop detection signal CLe is sent to the CPU for notification of stop of the clock signal.

In the semiconductor device 1 according to the first embodiment, it is possible for the arithmetic operation unit to recognize where the fault has occurred in the signal source of the clock signal or in a clock signal distribution path on the basis of which signal has been used for error notification, the main clock signal error signal SCLKe or the clock signal stop detection signal CLe. Therefore, in the semiconductor device 1 according to the first embodiment, it is possible to switch a coping system in accordance with a place where the fault has occurred. For example, when the error has been notified by using the main clock signal error signal SCLKe, there is a possibility that the fault may give adverse effect to the system and therefore it is possible to make the arithmetic operation unit perform processing of safely stopping the system. On the other hand, when the error has been notified by using the clock signal stop detection signal CLe, it is possible to make the arithmetic operation unit perform processing such as processing of switching to a functional block that would alternatively perform the processing concerned of the functional circuit that is located in a place where the error has occurred and so forth. In addition, in the semiconductor device 1 according to the first embodiment, when the fault has occurred in apart of the frequency division circuit 151 or the multiplication circuit 152, it is possible to continue the operation by selecting the circuit that no fault occurs.

Figure 2:
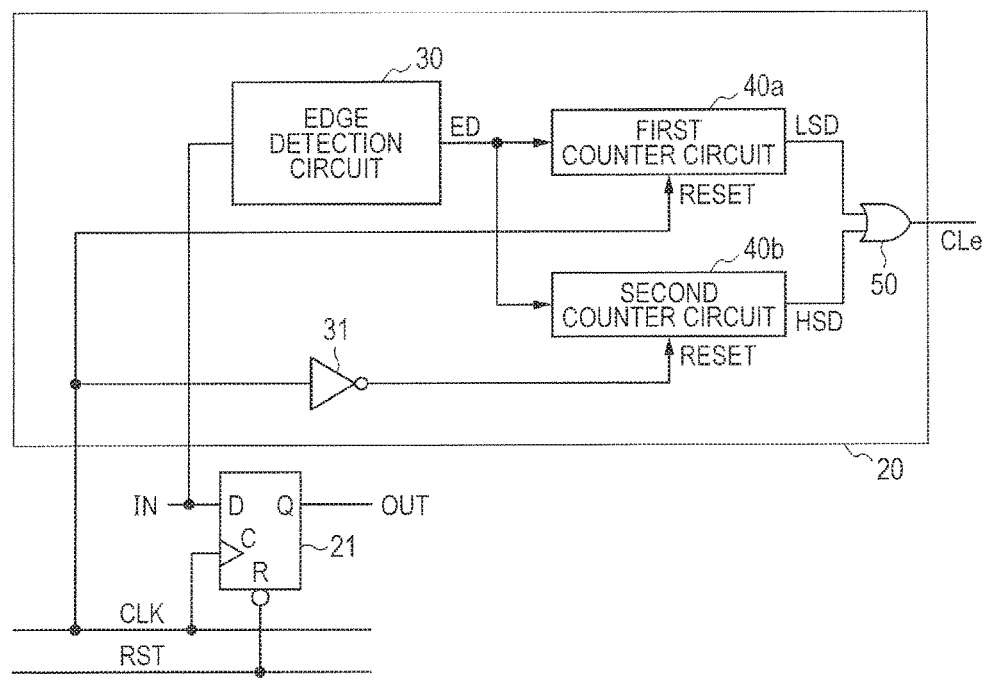
FIG. 2 is a block diagram illustrating one example of a clock signal stop detection circuit according to the first embodiment.

Then, the clock signal stop detection circuit 20 according to the first embodiment will be described in detail. Accordingly, FIG. 2 is a block diagram illustrating one example of the clock signal stop detection circuit 20 according to the first embodiment. In the example in FIG. 2, a block of a clock signal stop detection cell 2 that includes the clock signal stop detection circuit 20 and a flip-flop 21 that is an object for clock error detection by the clock signal stop detection circuit 20 is illustrated in order to describe the clock signal stop detection circuit 20 in more detail.

As illustrated in FIG. 2, the clock signal stop detection circuit 20 detects the abnormality of the synchronous clock signal (hereinafter, simply referred to as a clock signal CLK) that is supplied to the flip-flop 21 on the basis of input data IN that is input into the flip-flop 21 and the clock signal CLK that is also input into the flip-flop 21.

The flip-flop 21 is one example of a data retention circuit and is a D flip-flop that retains a logical level of the input data IN in accordance with a rising edge of the clock signal CLK and sets output data OUT to the retained logical level. In addition, when a reset signal RST shifts to a low level, the flip-flop 21 enters a reset state that an output is set to a first logical level (for example, the low level). This reset signal RST is supplied from, for example, the arithmetic operation unit installed on a host system or a reset circuit (not illustrated) in the semiconductor device 1.

The clock signal stop detection circuit 20 includes an edge detection circuit 30, an inverter circuit 31, a first counter 40a, a second counter 40b, a clock signal stop decision circuit 50 and so forth. Incidentally, although the clock signal stop detection circuit 20 also includes an inverter that outputs an inverted reset signal obtained by inverting the reset signal RST, illustration thereof is omitted in the example in FIG. 2. In the clock signal stop detection circuit 20, the first counter 40a and the second counter 40b are reset with the inverted reset signal. In the description on the example in FIG. 2, description on a resetting operation to be performed with the inverted reset signal is omitted.

The edge detection circuit 30 detects an edge of the input data IN and outputs a result of detection as an input edge detection signal ED. The input edge detection signal ED is a signal that shifts to a second logical level (for example, a high level) in a time period after a change in edge has occurred in the input data IN until the output data OUT reaches the logical level that is the same as the logical level of the input data IN. The inverter circuit 31 inverts the clock signal CLK and outputs the inverted clock signal.

The first counter 40a is reset with the clock signal CLK used for fetching the input data IN in the flip-flop 21 and counts an edge detection frequency of the edge detection circuit 30. In addition, the first counter 40a sets a L-level stop detection signal LSD to a high level when the count value has reached a count value indicating an overflow state and maintains the L-level stop detection signal LSD at the high level for a time period until supply of the clock signal is resumed. The second counter 40b is reset with the inverted clock signal that is output from the inverter circuit 31 and counts the edge detection frequency of the edge detection circuit 30. In addition, the second counter 40b sets a H-level stop detection signal HSD to the high level when the count value has reached the count value with which the second counter 40b reaches the overflow state and maintains the H-level stop detection signal HSD at the high level for the time period until supply of the clock signal is resumed. In addition, although details will be described later, the count value with which the counter 40a reaches the overflow state may be the same as the count value with which the second counter 40b reaches the overflow state and/or the count value of the second counter 40b may be larger than the count value of the first counter 40a by about 3 or more.

The clock signal stop decision circuit 50 outputs the clock signal stop detection signal CLe in accordance with a situation that one of the first counter 40a and the second counter 40b has reached the overflow state.

Figure 3:
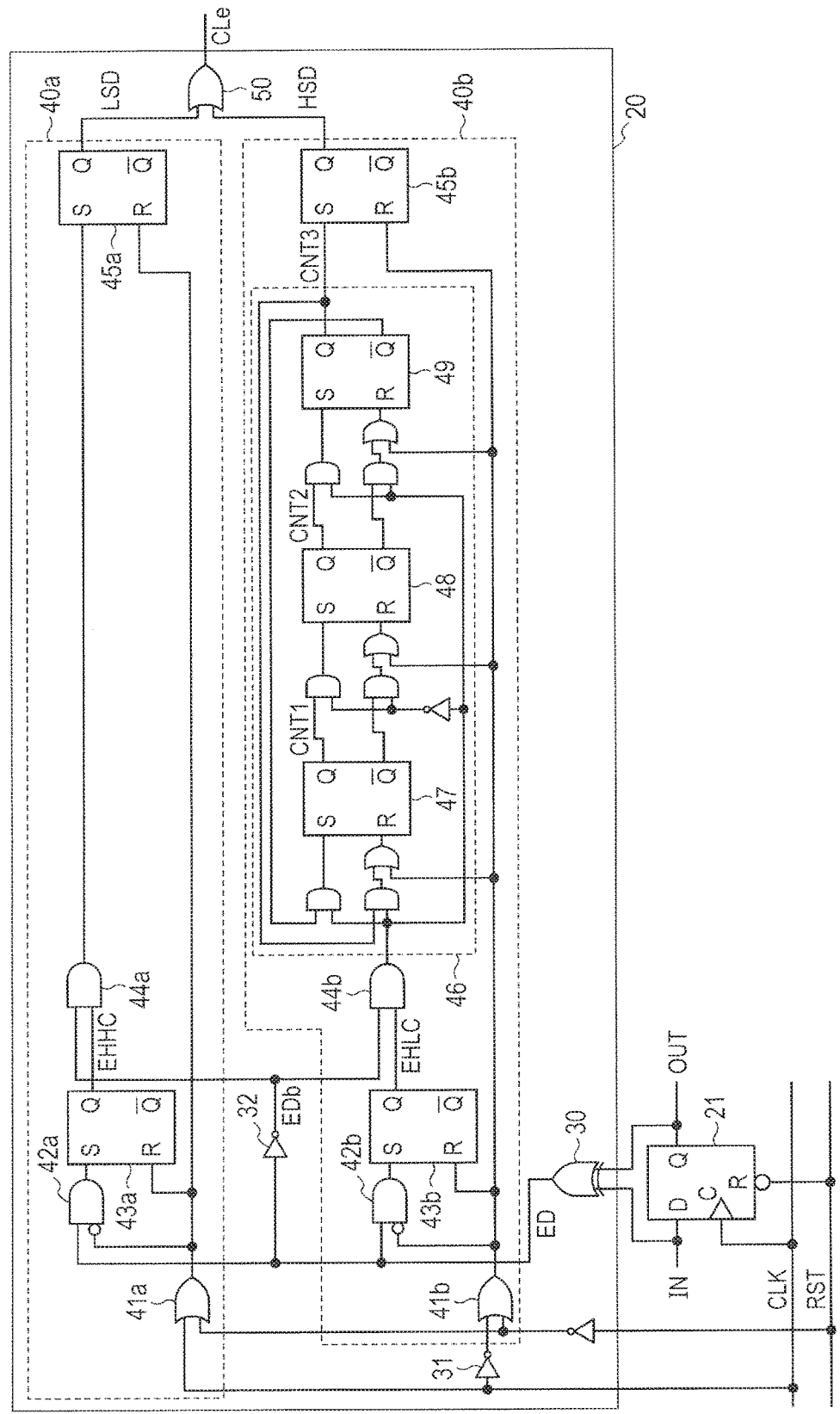
FIG. 3 is a circuit diagram illustrating one example of the clock signal stop detection circuit according to the first embodiment.

Then, a detailed circuit configuration of the clock signal stop detection circuit 20 according to the first embodiment will be described. Thus, FIG. 3 is a circuit diagram illustrating one example of the clock signal stop detection circuit 20 according to the first embodiment. In the circuit diagram illustrated in FIG. 3, the detailed circuit configuration of the edge detection circuit 30, the first counter 40a and the second counter 40b is illustrated. In addition, in the example in FIG. 3, an inverter that gives an inverted reset signal to each of the first counter 40a and the second counter 40b is illustrated.

As illustrated in FIG. 3, the edge detection circuit 30 is configured by an exclusive logical sum circuit (an ExOR circuit). The edge detection circuit 30 detects the edge of the input data IN in accordance with generation of a difference in logical level between signals at input and output terminals of the flip-flop 21. Specifically, the edge detection circuit 30 outputs the input edge detection signal ED that shifts to the high level in a time period from occurrence of the edge change of the input data IN of the flip-flop 21 to occurrence of the edge change of the output data OUT of the flip-flop 21. Incidentally, as the edge detection circuit 30, it is also possible to use a circuit that the ExOR circuit is combined with a delay circuit. In this case, the input data IN is branched, one piece of the branched input data IN is input into one input terminal of the ExOR circuit and the other piece of the branched input data IN is input into the other input terminal of the ExOR circuit via the delay circuit.

The first counter 40a includes an OR circuit 41a, a first gating circuit (for example, a gating circuit 42a), a first set/reset flip-flop (for example, an RSFF 43a), a second gating circuit (for example, a gating circuit 44a), a second set/reset flip-flop (for example, an RSFF 45a) and so forth.

The clock signal CLK is input into one input terminal of the OR circuit 41a and the inverted reset signal is input into the other input terminal of the OR circuit 41a. The OR circuit 41a sets an output to the high level in accordance with a situation that either of the clock signal CLK and the inverted reset signal has shifted to the high level. In addition, the OR circuit 41a resets the count value of the first counter 40a in accordance with the situation that either of the clock signal CLK and the inverted reset signal has shifted to the high level.

The gating circuit 42a allows passage of the output edge detection signal ED that the edge detection circuit 30 outputs in a time period that an output from the OR circuit 41a is at the low level. That is, the gating circuit 42a masks the input edge detection signal ED in a time period that the clock signal CLK or the reset signal RST is at the high level. The gating circuit 42a is a logical product circuit (an AND circuit) that one input terminal is configured as an inverting input terminal. The output from the OR circuit 41a is input into one input terminal (the inverting input side) of the gating circuit 42a and the input edge detection signal ED is input into the other input terminal of the gating circuit 42a.

The RSFF 43a resets an output to the low level with the high-level clock signal CLK or the low-level reset signal RST and sets the output to the high level in accordance with a situation that the output from the gating circuit 42a has shifted to the high level. The output from the gating circuit 42a is input into a set terminal S of the RSFF 43a and the output from the OR circuit 41a is input into a reset terminal R of the RSFF 43a. In the following, the output from the RSFF 43a will be referred to as an edge retention signal EHHC.

The gating circuit 44a outputs the output from the RSFF 43a to a rear-stage circuit in a time period that an inverted input edge detection signal EDb obtained by inverting the input edge detection signal ED is at the high level. The output from the RSFF 43a is input into one input terminal of the gating circuit 44a and the inverted input edge detection signal EDb is input into the other input terminal of the gating circuit 44a. The inverted input edge detection signal EDb is obtained by inverting the input edge detection signal ED by an inverter 32.

The RSFF 45a sets an output to the high level in accordance with a situation that the output from the gating circuit 44a has shifted to the high level and resets the output to the low level in accordance with a situation that the clock signal CLK has shifted to the high level or the reset signal RST has shifted to the low level. The output from the gating circuit 44a is input into a set terminal S of the RSFF 45a and the output from the OR circuit 41a is input into a reset terminal R of the RSFF 45a. In addition, the output signal from the SRFF 45a is the L-level stop detection signal LSD.

The second counter 40b includes an OR circuit 41b, a third gating circuit (for example, a gating circuit 42b), a third set/reset flip-flop (for example, an RSFF 43b), a fourth gating circuit (for example, a gating circuit 44b), a fourth set/reset flip-flop (for example, an RSFF 45b), a weight counter 46 and so forth.

The inverted clock signal is input into one input terminal of the OR circuit 41b and the inverted reset signal is input into the other input terminal of the OR circuit 41b. The inverted clock signal is a signal obtained by inverting the clock signal CLK by the inverter circuit 31. The OR circuit 41b sets an output to the high level in accordance with a situation that either of the inverted clock signal and the inverted reset signal has shifted to the high level. The OR circuit 41b resets the count value of the second counter 40b in accordance with a situation that either of the inverted clock signal and the inverted reset signal has shifted to the high level.

The gating circuit 42b allows passage of the input edge detection signal ED that the edge detection circuit 30 outputs in a time period that the clock signal CLK is at the high level (that is, the inverted clock signal is at the low level) and the reset signal is at the high level (that is, the inverted reset signal is at the low level). That is, the gating circuit 42b masks the input edge detection signal ED in a time period that the inverted clock signal or the inverted reset signal is at the high level. The gating circuit 42b is a logical product circuit (an AND circuit) that one input terminal is configured as an inverting input terminal. The output from the OR circuit 41b is input into one input terminal (the inverting input side) of the gating circuit 42b and the input edge detection signal ED is input into the other input terminal of the gating circuit 42b.

The RSFF 43b resets an output to the low level with the low-level clock signal CLK (that is, the high-level inverted clock signal) or the low-level reset signal RST (that is, the high-level inverted reset signal) and sets the output to the high level in accordance with a situation that the output from the gating circuit 42b has shifted to the high level. The output from the gating circuit 42b is input into a set terminal S of the RSFF 43b and the output from the OR circuit 41b is input into a reset terminal R of the RSFF 43b. In the following, the output from the RSFF 43b will be referred to as an edge retention signal EHLC.

The gating circuit 44b outputs the output from the RSFF 43b to a rear-stage circuit in a time period that the inverted input edge detection signal EDb obtained by inverting the input edge detection signal ED is at the high level. The output from the RSFF 43b is input into one input terminal of the gating circuit 44b and the inverted input edge detection signal EDb is input into the other input terminal of the gating circuit 44b. The inverted input edge detection signal EDb is obtained by inverting the input edge detection signal ED by the inverter 32.

The weight counter 46 starts a counting operation in accordance with to a situation that the output from the gating circuit 44b has shifted to the high level, increments the count value in accordance with the edge of the output from the gating circuit 44b, and resets the count value in accordance with a situation that the clock signal has shifted to the low level (that is, the inverted clock signal has shifted to the high level) or the reset signal RST has shifted to the low level (that is, the inverted reset signal has shifted to the high level).

The weight counter 46 includes two first toggle flip-flops and one second toggle flip-flop, one and the other of the first toggle flip-flops are alternately coupled in series with the second toggle flip-flop and an output terminal of the final stage is loop-coupled to an input terminal of an initial stage. The first toggle flip-flops each is reset with the low-level clock signal CLK (that is, the high-level inverted clock signal) or the low-level reset signal RST (that is, the high-level inverted reset signal) and sets an output to a logical level of a signal that is input in accordance with the high-level inverted input edge detection signal EDb. In the example in FIG. 3, toggle flip-flops that respectively include RSFFs 47 and 49 correspond to the first toggle flip-flops. The second toggle flip-flop is reset with the low-level clock signal CLK (that is, the high-level inverted clock signal) or the low-level reset signal RST (that is, the high-level inverted reset signal) and sets an output to a logical level of a signal that is input in accordance with the low-level inverted input edge detection signal EDb. In the example in FIG. 3, a toggle flip-flop that includes an RSFF 48 corresponds to the second toggle flip-flop.

Here, the toggle flip-flop that configures the weight counter 46 will be described. As illustrated in FIG. 3, in the weight counter 46, one toggle flip-flop is configured by two AND circuits, one OR circuit, and one RSFF. In the following, the toggle flip-flop so configured will be referred to as a count unit circuit as the case may be. In the weight counter 46, the output from the gating circuit 44b is input into one input terminals of the AND circuits of the initial stage count unit circuit and the third stage count unit circuit. That is, the initial stage count unit circuit and the third stage count unit circuit increment the count values with the high-level output from the gating circuit 44b. An inversion signal at the output terminal of the gating circuit 44b is input into one input terminal of the AND circuit of the second stage count unit circuit. That is, the second stage count unit circuit increments the count value with the low-level output from the gating circuit 44b. Then, in the weight counter 46, the count unit circuits are mutually series-coupled in order of the initial stage count unit circuit, the second stage count unit circuit, and the third stage count unit circuit, and an output terminal of the third stage count unit circuit is loop-coupled to an input terminal of the initial stage count unit circuit, and thereby a counter circuit is configured. In addition, an output signal from the initial stage count unit circuit is designated by CNT1, an output signal from the second stage count unit circuit is designated by CNT2, and an output signal from the third stage count unit circuit is designated by CNT3.

The RSFF 45b sets an output to the high level in accordance with a situation that the output of the third stage count unit circuit of the weight counter 46 has shifted to the high level and resets the output to the low revel in accordance with a situation that the clock signal CLK has shifted to the low level (that is, the inverted clock signal has shifted to the high level) or the reset signal RST has shifted to the low level (that is, the inverted reset signal has shifted to the high level). The output from the weight counter 46 is input into a set terminal S of the RSFF 45b and the output from the OR circuit 41b is input into a reset terminal R of the RSFF 45b.

In addition, the output signal from the SRFF 45*b* is the H-level stop detection signal HSD.

Then, operations of the clock signal stop detection circuit 20 according to the first embodiment will be described. Thus, FIG. 4 to FIG. 9 are timing charts respectively illustrating examples of the operations of the clock signal stop detection circuit 20 according to the first embodiment. Incidentally, FIG. 4 to FIG. 6 each illustrates one example of a case where the edge change of the input data IN occurs before a timing that an rising edge of the clock signal CLK is input and a time of such a length that it is possible to ensure a setup time for the flip-flop 21 is ensured between the timing that the rising edge of the clock signal CLK is input and a timing that the edge change of the input data IN occurs. In addition, FIG. 7 to FIG. 9 each illustrates one example of a case where the edge change of the input data IN occurs after the timing that the rising edge of the clock signal CLK is input and a time of such a length that it is possible to ensure a hold time for the flip-flop 21 is ensured between the timing that the rising edge of the clock signal CLK is input and the timing that the edge change of the input data IN occurs.

Figure 4:
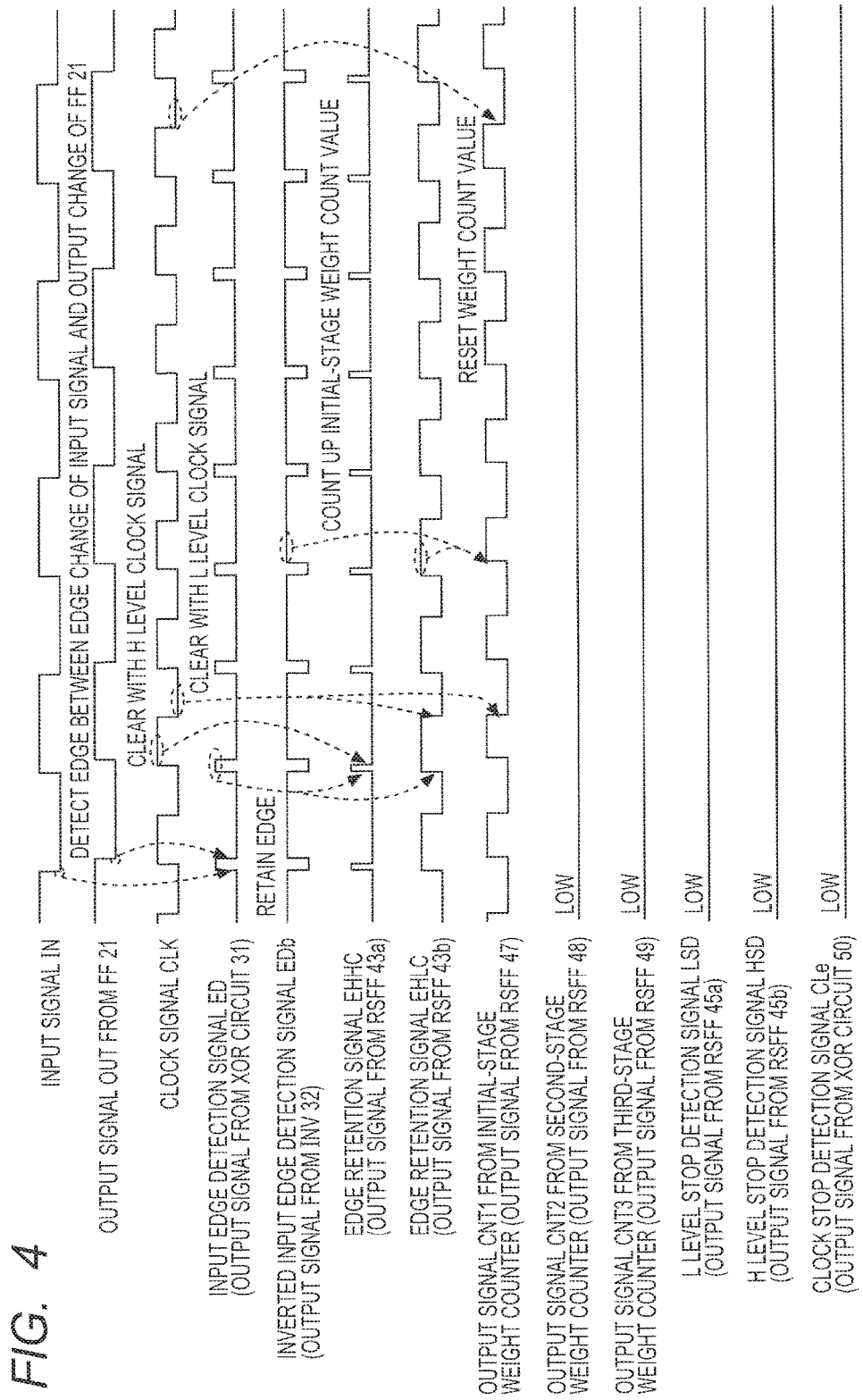
FIG. 4 is a timing chart illustrating a first example of an operation of the clock signal stop detection circuit according to the first embodiment to be performed in a state where a clock signal is not stopped.

FIG. 4 is a timing chart illustrating one example of the operation of the clock signal stop detection circuit 20 according to the first embodiment to be performed in a state where the clock signal is not stopped. As illustrated in FIG. 4, in the clock signal stop detection circuit 20 according to the first embodiment, the edge detection circuit 30 outputs the input edge detection signal ED that shifts to the high level in a time period between the edge change of the input data IN and the edge change of the output data OUT of the flip-flop 21. Then, the edge retention signal EHHC and the edge retention signal EHLC rise in a time period that the input edge detection signal ED is at the high level. After having been set to the high level, the edge retention signal EHHC is reset to the low level in accordance with a situation that the clock signal CLK shifts to the high level. After having been set to the high level, the edge retention signal EHLC is reset to the low level in accordance with a situation that the clock signal CLK shifts to the low level.

In addition, in the second counter 40*b*, the count value of the initial stage count unit circuit of the weight counter 46 is counted up in accordance with a situation that the edge retention signal EHLC has shifted to the high level and the inverted input edge detection signal EDb has shifted to the high level. However, when the clock signal CLK is normally supplied, the clock signal CLK shifts to the low level before the next rising edge of the inverted input edge detection signal EDb with which the weight counter 46 is counted up is input into the weight counter 46, and therefore the count value of the weight counter 46 is reset to the low level with the low-level clock signal CLK. Thereby, when the clock signal CLK is normally supplied to the flip-flop 21, the H-level stop detection signal HSD is maintained at the low level.

In addition, the L-level stop detection signal LSD shifts to the high level when the edge retention signal EHHC has shifted to the high level and the inverted input edge detection signal EDb has shifted to the high level. However, in the example illustrated in FIG. 4, the edge retention signal EHHC is reset with the clock signal CLK before the inverted input edge detection signal EDb shifts to the high level. Therefore, when the clock signal CLK is normally supplied to the flip-flop 21, the L-level stop detection signal LSD is maintained at the low level. When the clock signal CLK is normally supplied to the flip-flop 21, both of the L-level stop detection signal LSD and the H-level stop detection signal HSD are maintained at the low levels in this way, and therefore the clock signal stop detection circuit 20 does not enter a state where occurrence of the error is notified by using the clock signal stop detection signal CLe (for example, a state where the clock signal stop detection signal CLe shifts to the high level).

Figure 5:
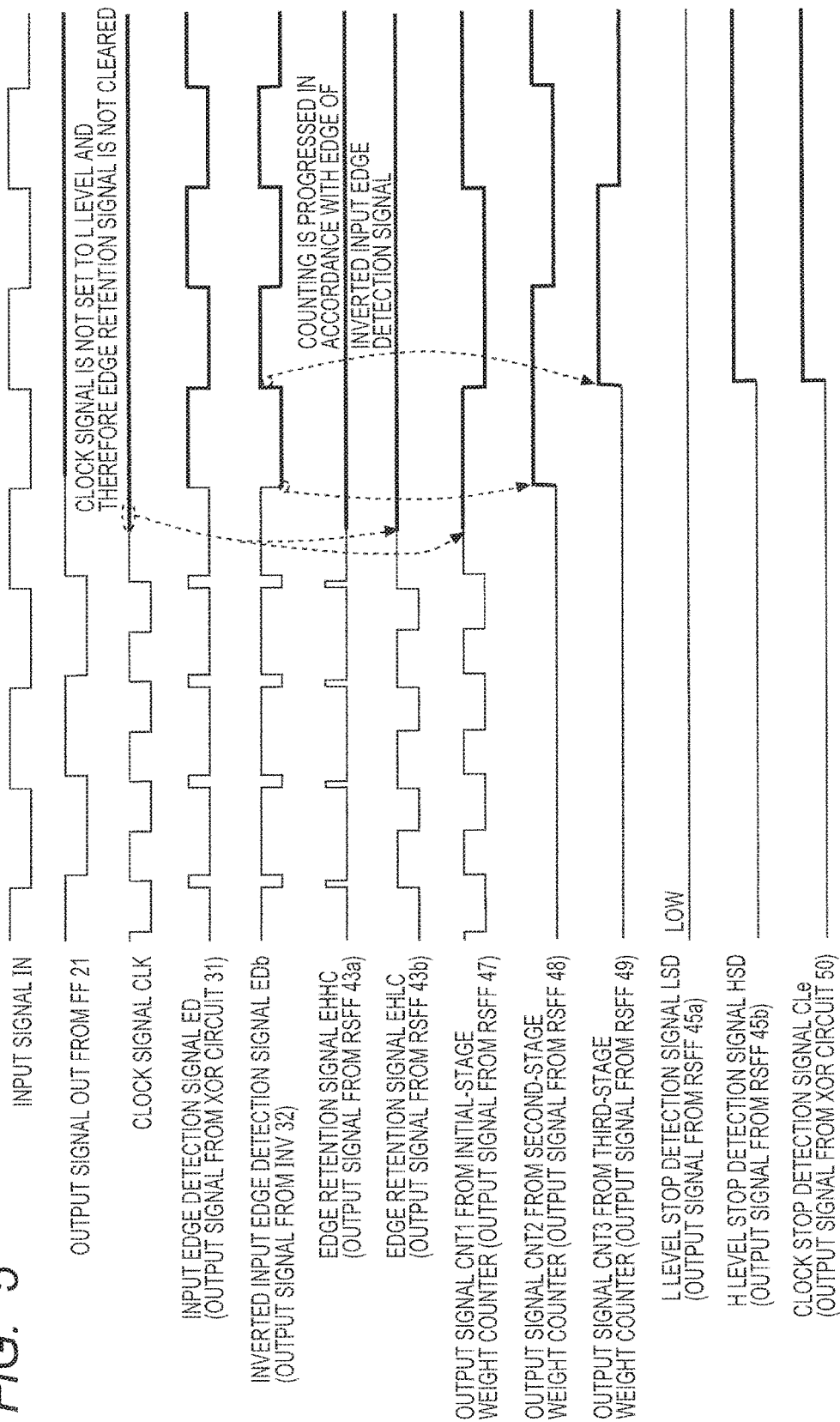
FIG. 5 is a timing chart illustrating a first example of an operation of the clock signal detection circuit according to the first embodiment to be performed when the clock signal is stopped at a high level.

FIG. 5 is a timing chart illustrating one example of the operation of the clock signal stop detection circuit 20 according to the first embodiment to be performed when an abnormal state that the clock signal is fixed at the high level has occurred. As illustrated in FIG. 5, when the clock signal CLK has been stopped in the high level state, the edge retention signal EHLC is not reset with the clock signal CLK and is maintained at the high level. In addition, the logical levels of the input edge detection signals ED and EDb shift in accordance with the level change of the input signal. Therefore, the count value of the weight counter 46 is counted up in accordance with the edge change of the input data IN. Then, the H-level stop detection signal HSD that the RSFF 45*b* outputs shifts to the high level in accordance with a situation that the output from the RSFF 49 has shifted to the high level. In addition, the clock signal stop detection signal CLe shifts to the high level in accordance with a situation that the H-level stop detection signal HSD has shifted to the high level. In addition, as illustrated in FIG. 5, the timing that the abnormality of the clock signal CLK is notified with the clock signal stop detection signal CLe becomes the same as the timing that second edge change of the input data IN occurs after occurrence of the error in the clock signal CLK.

In case of the example illustrated in FIG. 5, the edge retention signal EHHC is maintained at the low level. This is because the clock signal CLK that is input into the inverting input side of the gating circuit 42*a* is fixed at the high level and the input edge detection signal ED is masked by the gating circuit 42*a*.

Figure 6:
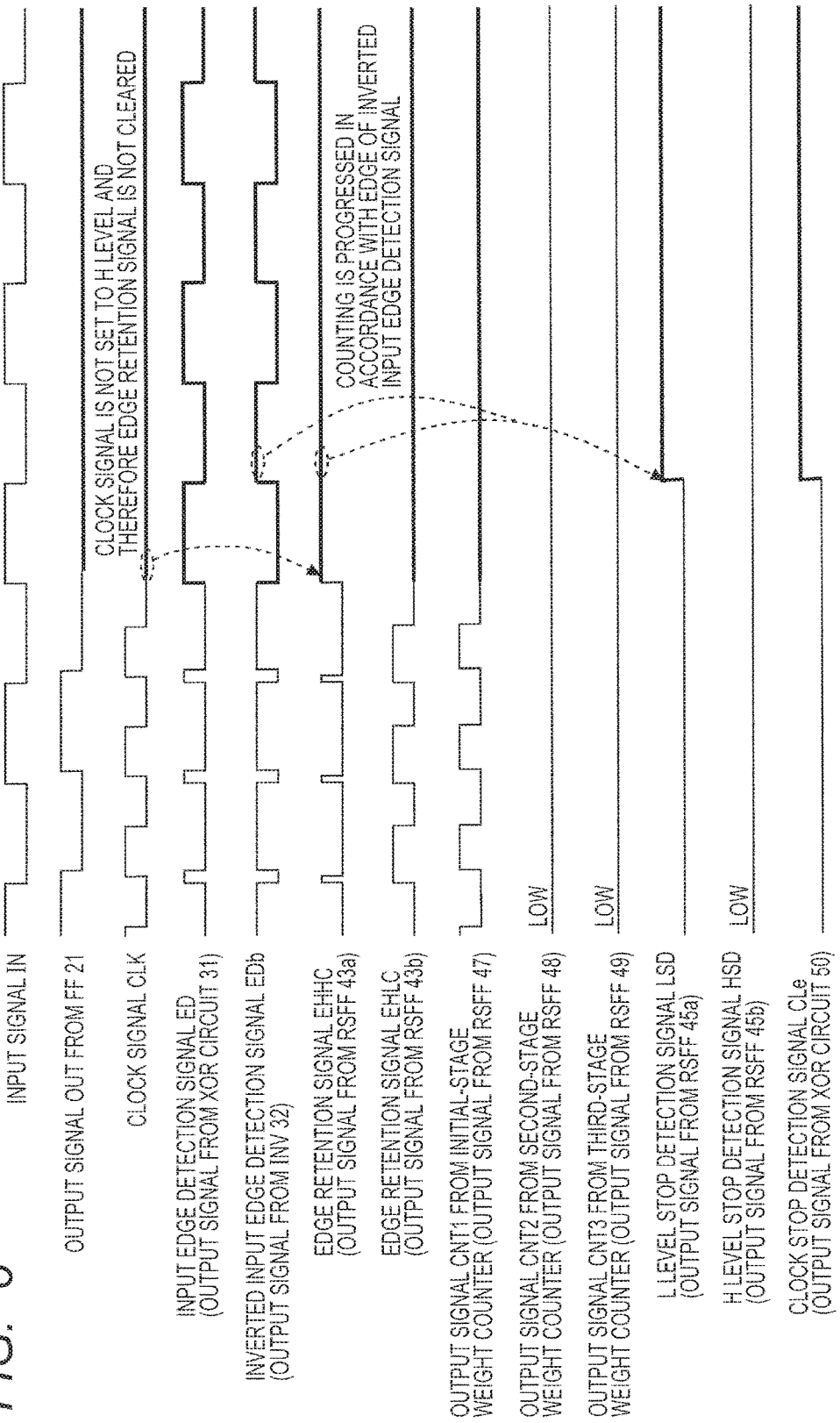
FIG. 6 is a timing chart illustrating a first example of an operation of the clock signal detection circuit according to the first embodiment to be performed when the clock signal is stopped at a low level.

FIG. 6 is a timing chart illustrating one example of the operation of the clock signal stop detection circuit 20 according to the first embodiment to be performed when an abnormal state that the clock signal is fixed at the low level has occurred. As illustrated in FIG. 6, when the clock signal CLK has been stopped in the low level state, the edge retention signal EHHC is not reset with the clock signal CLK and is maintained at the high level. In addition, the logical levels of the input edge detection signals ED and EDb shift in accordance with the level change of the input signal. Therefore, the logical level of the L-level stop detection signal LSD that the RSFF 45*a* outputs shifts to the high level conforming with the logical level of the edge retention signal EHHC at a timing that the level of the input data is changed for the first time after the clock signal CLK has been stopped. In addition, the clock signal stop detection signal CLe shifts to the high level in accordance with a situation that the L-level stop detection signal LSD has shifted to the high level. In addition, as illustrated in FIG. 6, the timing that the abnormality of the clock signal CLK is notified with the clock signal stop detection signal CLe becomes the same as the timing of occurrence of the first edge change of the input data IN after occurrence of the error in the clock signal CLK.

Incidentally, in case of the example illustrated in FIG. 6, the edge retention signal EHLC is maintained at the low level. This is because the clock signal CLK that is input into the inverting input side of the gating circuit 42*b* is fixed at the high level (that is, the inverted clock signal is fixed at the high level) and the input edge detection signal ED is masked by the gating circuit 42*b*.

Figure 7:
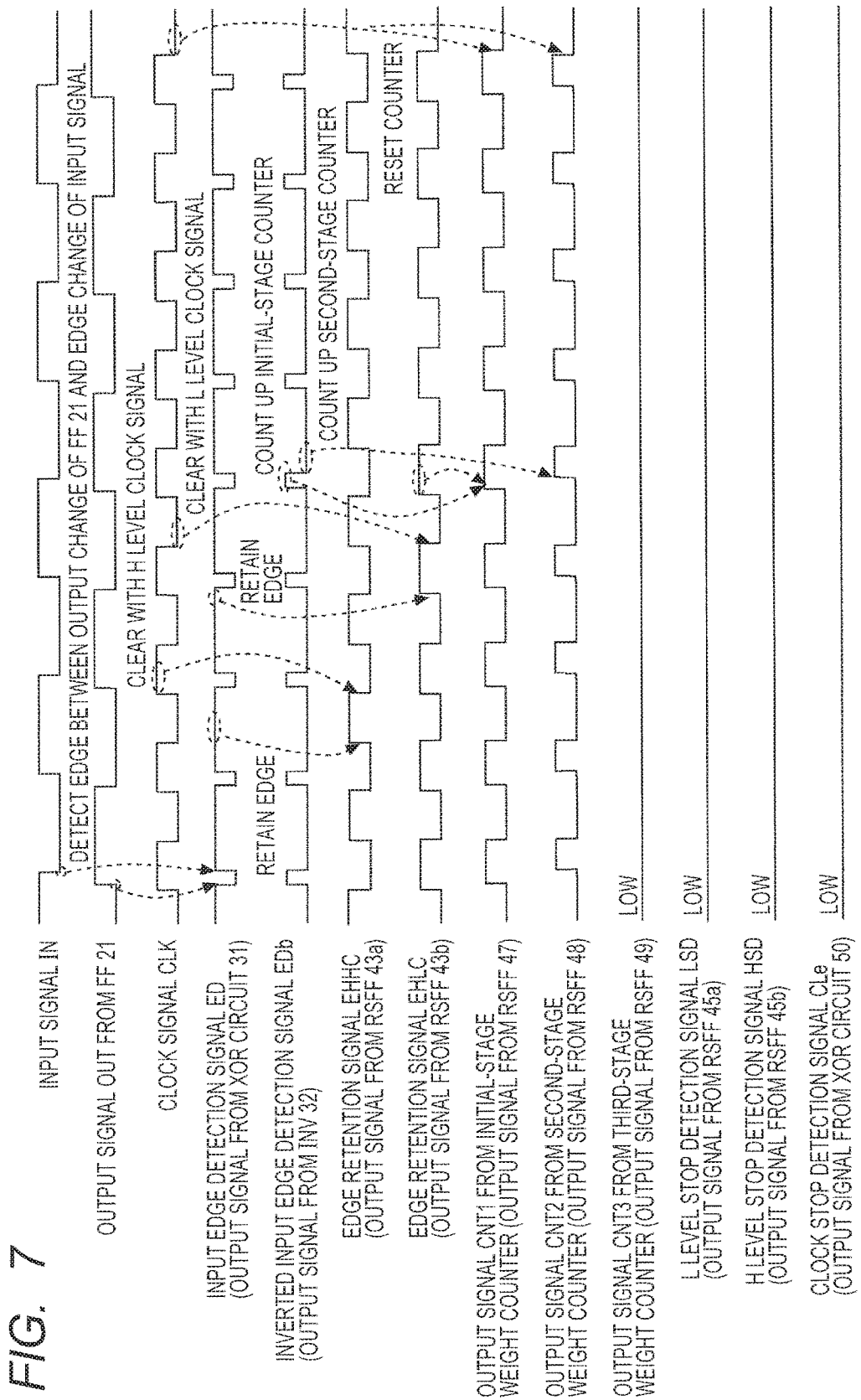
FIG. 7 is a timing chart illustrating a second example of the operation of the clock signal stop detection circuit according to the first embodiment to be performed in the state where the clock signal is not stopped.

FIG. 7 is a timing chart illustrating one example of the operation of the clock signal stop detection circuit 20 according to the first embodiment to be performed in a state that the clock signal is not stopped. In the operation illustrated in FIG. 7, the operation that is performed until the count value is set to the initial stage count unit circuit of the weight counter 46 is the same as that of the example illustrated in FIG. 4. Thus, here, in the example in FIG. 7, points that are different from those in the example in FIG. 4 will be described.

In the example illustrated in FIG. 7, the edge change of the input data IN occurs after the rising edge of the clock signal CLK has been input. Therefore, a timing that the input edge detection signal EDb shifts to the high level comes after a timing that the rising edge of the clock signal CLK is input and the length of the time period that the input edge detection signal EDb is maintained at the high level is shorter than that in the example illustrated in FIG. 4. Thereby, the inverted input edge detection signal EDb shifts to the low level before the weight counter 46 is reset after the count value has been set to the initial stage count unit circuit of the weight counter 46. Accordingly, in the example illustrated in FIG. 7, counting-up of the count value is advanced up to the second stage count unit circuit of the weight counter 46. However, since the weight counter 46 includes the three stages of the count unit circuits, the H-level stop detection signal HSD and the clock signal stop detection signal CLe are maintained at the low levels. Incidentally, in the example illustrated in FIG. 7, the clock signal CLK shifts to the low level before the edge of the inverted input edge detection signal EDb is input after the weight counter 46 has started a counting operation. Therefore, the weight counter 46 is reset without advancing counting-up up to the third stage count unit circuit.

Figure 8:
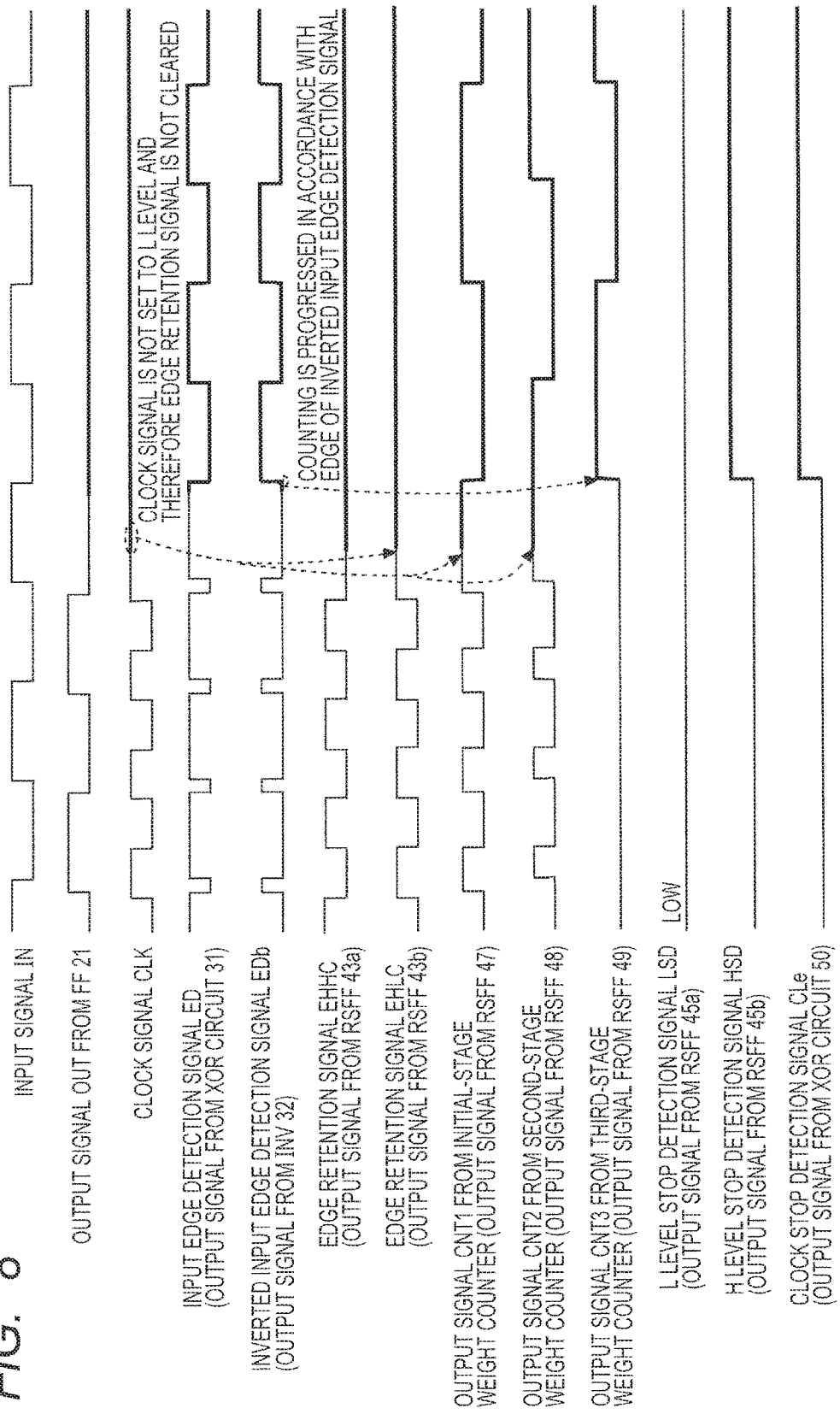
FIG. 8 is a timing chart illustrating a second example of the operation of the clock signal stop detection circuit according to the first embodiment to be performed when the clock signal is stopped at the high level.

FIG. 8 is a timing charge illustrating one example of the operation of the clock signal stop detection circuit 20 according to the first embodiment to be performed when an abnormality state that the clock signal is fixed at the high level has occurred. In the operation illustrated in FIG. 8, the operation performed until the count value is set to the initial stage count unit circuit of the weight counter 46 is the same as that in the example illustrated in FIG. 5. Accordingly, here, points that are different from those in the example in FIG. 5 will be described.

In the example illustrated in FIG. 8, counting-up by the weight counter 46 is advanced up to the second stage count unit circuit at a time point that the clock signal CLK has been fixed to the high level. Therefore, counting-up by the weight counter 46 is advanced up to the third stage count unit circuit at a rising edge of the inverted input edge detection signal EDb that rises in accordance with falling of the input data IN after the abnormality of the clock signal CLK has occurred and the H-level stop detection signal HSD shifts to the high level. Then, the clock signal stop detection signal CLe shifts to the high level in accordance with a situation that the H-level stop detection signal HSD has shifted to the high level.

Figure 9:
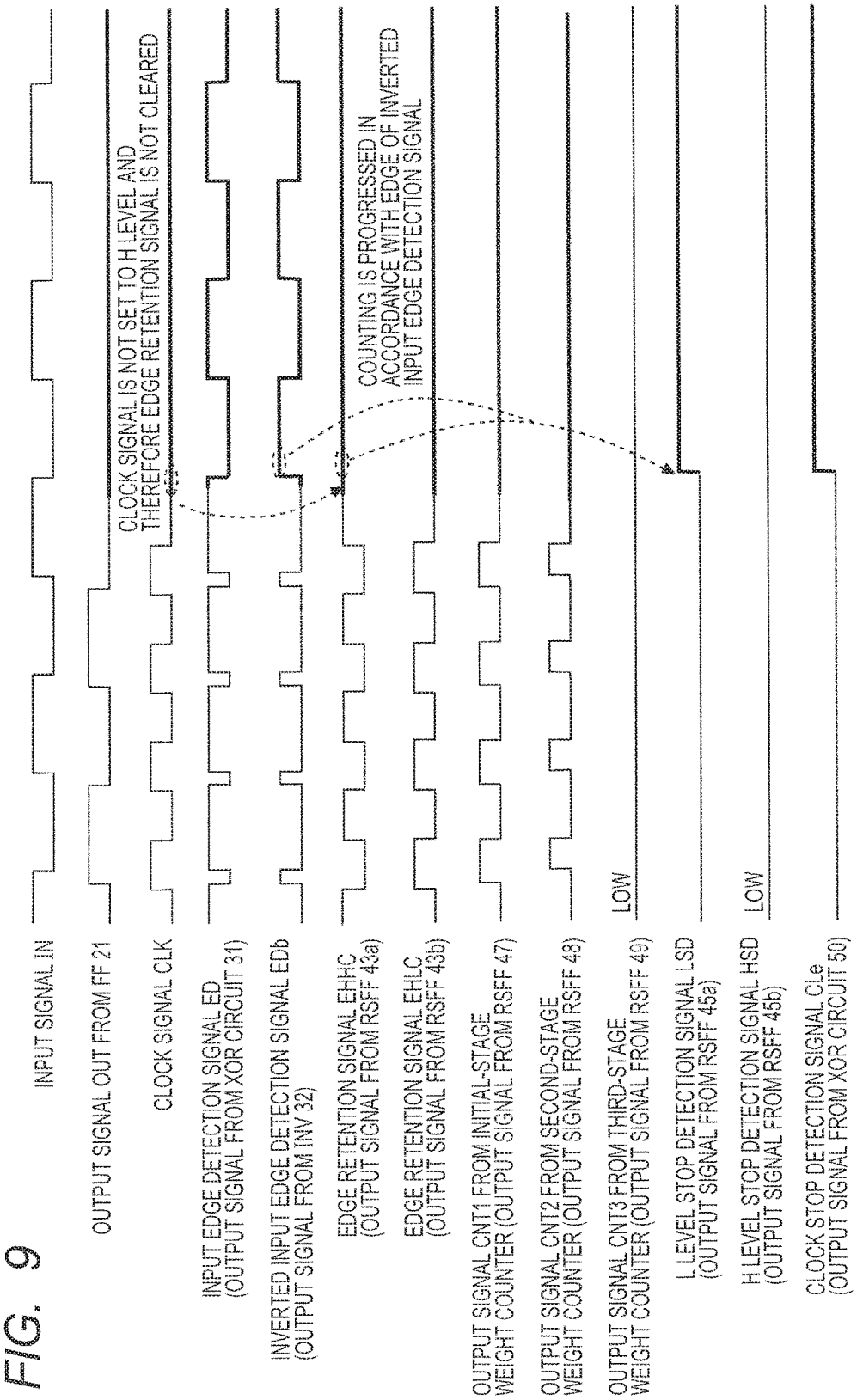
FIG. 9 is a timing chart illustrating a second example of the operation of the clock signal stop detection circuit according to the first embodiment to be performed when the clock signal is stopped at the low level.

FIG. 9 is a timing chart illustrating one example of the operation of the clock signal stop detection circuit 20 according to the first embodiment to be performed when an abnormal state that the clock signal is fixed at the low level has occurred. In the following, only operations that are different between the operations illustrated in FIG. 6 and the operations illustrated in FIG. 9 will be described.

In the example illustrated in FIG. 9, the weight counter 46 and the RSFF 43b enter reset states at a time point that the clock signal CLK has been fixed at the low level. Therefore, the counting operation by the weight counter 46 is not advanced after the abnormality has occurred in the clock signal CLK. On the other hand, since the edge retention signal EHHC shifts to the high level at the time point that the clock signal CLK has been fixed at the low level, the edge retention signal EHHC is not reset after that. That is, the edge retention signal EHHC is maintained at the high level after occurrence of the abnormality in the clock signal CLK. Then, the inverted input edge detection signal EDb shifts to the high level in accordance with the first edge change of the input data IN after occurrence of the abnormality in the clock signal CLK. The L-level stop detection signal LSD shifts to the high level in accordance with switching of the inverted input edge detection signal EDb to the high level. Then, the clock signal stop detection signal CLe shifts to the high level in accordance with a situation that the L-level stop detection signal LSD has shifted to the high level.

As described above, since the semiconductor device 1 according to the first embodiment includes the clock signal stop detection circuit 20, it is possible to detect that the clock signal CLK has been stopped by using the clock signal of one system and the input data IN into the flip-flop 21. Thereby, it becomes possible for the semiconductor device 1 according to the first embodiment to detect stop of the clock signal at a destination to which the clock signal has been distributed by using the clock signal stop detection circuit 20.

In addition, in the semiconductor device 1 according to the first embodiment, it is enough to simply monitor the input data IN and the clock signal CLK that are input into the flip-flop 21 when the clock signal stop detection circuit 20 detects the abnormality of the clock signal CLK. Therefore, it becomes possible for the semiconductor device 1 according to the first embodiment to detect stop of the clock signal CLK with no adverse effect on the operation of the flip-flop 21 that is used for data processing in the functional circuits of the clock signal stop detection circuit 20.

In addition, in the semiconductor device 1 according to the first embodiment, it is possible to directly monitor the clock signal CLK supplied to the flip-flop 21 that is actually used for the data processing by the clock signal stop detection circuit 20. Thereby, it becomes possible for the semiconductor device 1 according to the first embodiment to improve reliability of the semiconductor device.

In addition, in the semiconductor device 1 according to the first embodiment, it is also possible to prevent occurrence of malfunctions also when the minimum count number of the first counter 40a in the clock signal stop detection circuit 20 is set to about 2 and the minimum count number of the second counter 40b in the clock signal stop detection circuit 20 is set to about 3. Thereby, it becomes possible for the semiconductor device 1 according to the first embodiment to immediately detect occurrence of the abnormality in the clock signal CLK.

In addition, in the semiconductor device 1 according to the first embodiment, the clock signal stop detection circuit 20 detects the abnormality of the clock signal CLK with one clock signal CLK. Thereby, in the semiconductor device 1 according to the first embodiment, it becomes possible to improve the reliability of the semiconductor device 1 by arranging the clock signal stop detection circuits 20 on a plurality of places. In addition, in the semiconductor device 1 according to the first embodiment, it becomes possible to improve flexibility of countermeasures that would be taken in occurrence of clock errors by arranging the clock signal stop detection circuits 20 on the plurality of places of a clock signal distribution destination.

In addition, in the semiconductor device 1 according to the first embodiment, the first counter 40a and the second counter 40b maintain the logical levels of the L-level stop detection signal LSD and the H-level stop detection signal HSD are maintained after error detection. Thereby, in the semiconductor device 1 according to the first embodiment, it becomes possible to execute level interruption processing for maintaining error notification until a cause for the error notification is eliminated in the arithmetic operation unit that receives the error notification. It becomes possible for the semiconductor device 1 to improve the flexibility of countermeasure processing to be executed after error occurrence also by performing the level interruption processing. It is also possible to maintain the logical levels of the L-level stop detection signal LSD and the H-level stop detection signal HSD until the inverted reset signal is switched to the high level by directly inputting the inverted reset signal into the reset terminals of the RSFFs 45a and 45b in addition to the configuration illustrated in FIG. 3.

In addition, in the semiconductor device 1 according to the first embodiment, the count value with which the second counter 40b reaches the overflow state is made larger than that of the first counter 40a by about 3 or more. Thereby, in the semiconductor device 1 according to the first embodiment, it becomes possible to prevent occurrence of the malfunctions not depending on time relations between the timing for edge inputting of the clock signal CLK and the timing for logical level shifting of the input data IN. Incidentally, when it is ensured that the time relations between the timing for edge inputting of the clock signal CLK and the timing for logical level shifting of the input data IN are the relations as in the timing chart illustrated in FIG. 4, the count value with which the second counter 40b reaches the overflow state may be made the same as the count value with which the first counter 40a reaches the overflow state.

Second Embodiment

Figure 10:
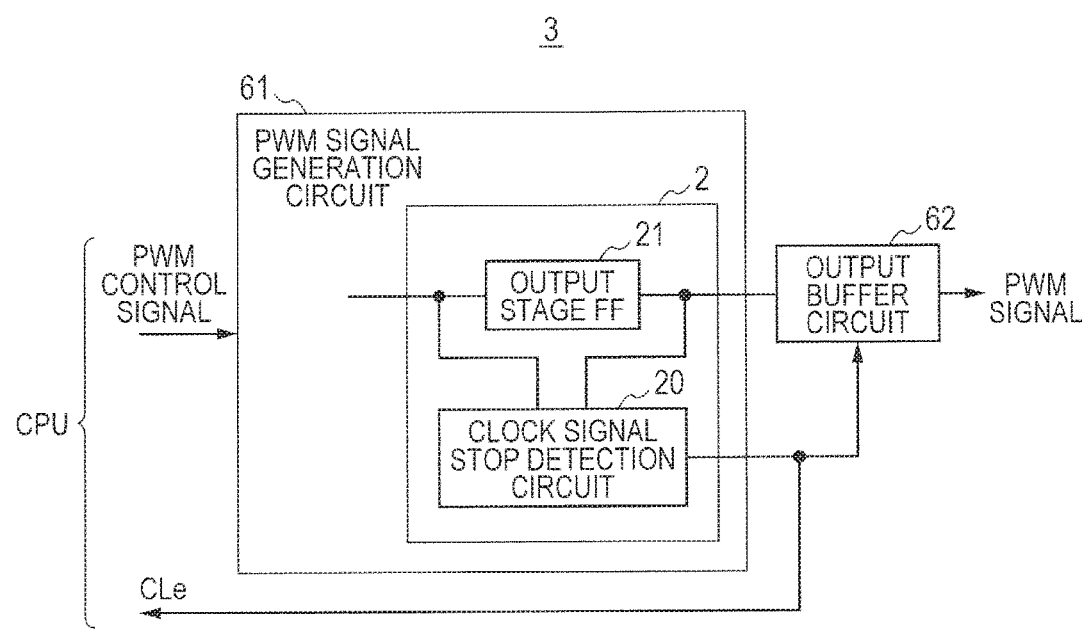
FIG. 10 is a block diagram illustrating one example of a semiconductor device according to a second embodiment.

In the second embodiment, another example of the semiconductor device using the clock signal stop detection circuit 20 will be described. Thus, FIG. 10 is a block diagram illustrating one example of a semiconductor device 3 according to the second embodiment. In the description on the second embodiment, the same numerals as those in the first embodiment are assigned to the same constitutional elements as those in the first embodiment and description thereon is omitted.

As illustrated in FIG. 10, the semiconductor device 3 according to the second embodiment uses the clock signal stop detection cell 2 as an output-stage flip-flop of a PWM signal generation circuit 61 that outputs a PWM signal. The PWM signal generation circuit 61 outputs the PWM signal on the basis of a PWM control signal for directing a frequency of the PWM signal and a duty ratio of the PWM signal from the arithmetic operation unit such as the CPU and so forth. The PWM signal generation circuit 61 may be, for example, packed into one chip together with the arithmetic operation unit. In the PWM signal generation circuit 61, the flip-flop 21 of the clock signal stop detection cell 2 is used as the output-stage flip-flop. In addition, the clock signal stop detection circuit 20 is installed in the form of subordinating the flip-flop 21. An output buffer circuit 62 is an amplification circuit adapted to transmit an output from the PWM signal generation circuit 61 to a rear-stage circuit.

In the semiconductor device 3 according to the second embodiment, the clock signal stop detection signal CLe that the clock signal stop detection circuit 20 outputs is transmitted to the arithmetic operation unit such as the CPU and so forth and the PWM signal generation circuit so as to notify of occurrence of the abnormality. Thereby, in the arithmetic operation unit that has received the notification of occurrence of the abnormality such as the clock error and so forth, it is possible to take countermeasures that the influence on the system is taken into account. In addition, in the PWM signal generation circuit 61, it becomes possible to switch an output impedance to a high impedance or to control the output impedance to a predetermined value, conforming with notification of the clock error, with no intervention of processing to be executed by the arithmetic operation unit such as the CPU and so forth.

As described above, in the semiconductor device 3 according to the second embodiment, it is possible to detect the abnormality of the clock signal CLK that is supplied to the output-stage flip-flop that operates on the basis of the supplied clock signal CLK of one system. Then, when the abnormality has been detected, in the semiconductor device 3 according to the second embodiment, it is possible to switch the output state of the PWM signal generation circuit 61 and to perform countermeasure processing against the error in the external arithmetic operation unit.

Third Embodiment

Figure 11:
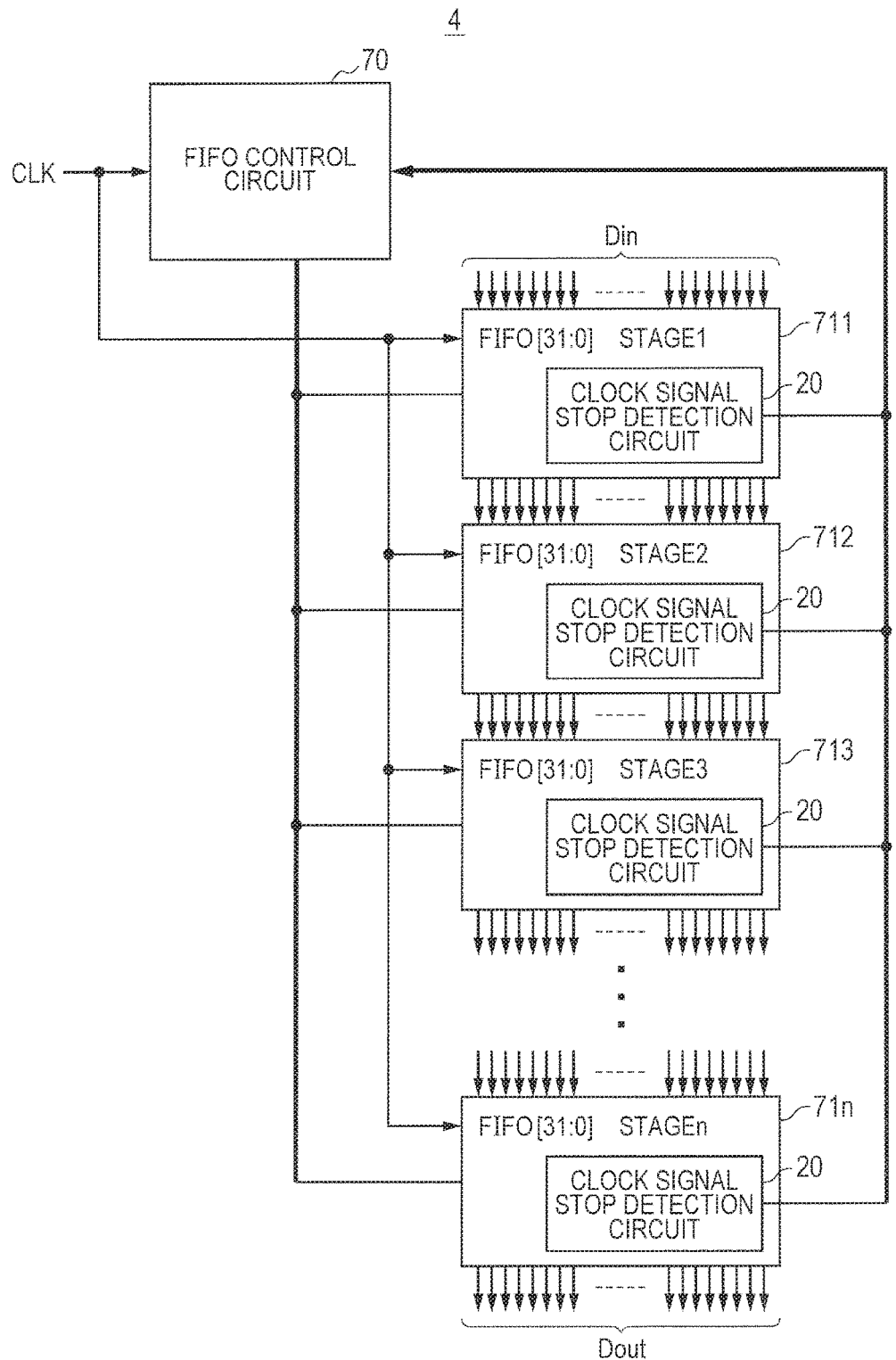
FIG. 11 is a block diagram illustrating one example of a semiconductor device according to a third embodiment.

In the third embodiment, one example that the clock signal stop detection cell 2 has been used as a register in an FIFO memory will be described. FIG. 11 is a block diagram illustrating one example of a semiconductor device 4 according to the third embodiment. Incidentally, in the description on the third embodiment, the same numerals as those in the first embodiment are assigned to the same constitutional elements as those in the first embodiment and description thereon is omitted.

As illustrated in FIG. 11, the semiconductor device 4 according to the third embodiment includes an FIFO control circuit 70 and FIFO stages 711 to 71n. The FIFO stages each is configured by the FIFO memory of one stage. The example illustrated in FIG. 11 is an example of a memory configured by n stages of the FIFO memories. Then, each of the FIFO stages 711 to 71n uses the clock signal stop detection cell 2 as the register in each stage. One example of the clock signal stop detection circuit 20 in the clock signal stop detection cell 2 is illustrated in FIG. 11.

In the semiconductor device 4 according to the third embodiment, the FIFO control circuit 70 performs control as to which FIFO stage it uses and management as to up to which FIFO stage the data is stored. The FIFO control circuit 70 and the FIFO stages 711 to 71n all operate on the basis of the clock signal supplied from a not illustrated clock signal generation circuit.

In addition, in the semiconductor device 4 according to the third embodiment, each clock signal stop detection circuit 20 in each stage outputs the clock signal stop detection signal CLe. Then, the FIFO control circuit 70 performs malfunction avoiding processing such as invalidation of one FIFO stage whose error has been notified by using the clock signal stop detection signal CLe and so forth.

In the semiconductor device 4 according to the third embodiment, since it is possible to decide whether the error is present for every FIFO stage, it is possible to flexibly perform error recovery processing such as processing of invalidating the FIFO stage that the error has occurred and continuously performing the operation and so forth. In addition, in the semiconductor device 4 according to the third embodiment, since it is possible to avoid such a situation that it becomes difficult to use the entire device due to the faults occurred in some circuits, it becomes possible to increase fault resistance.

Fourth Embodiment

Figure 12:
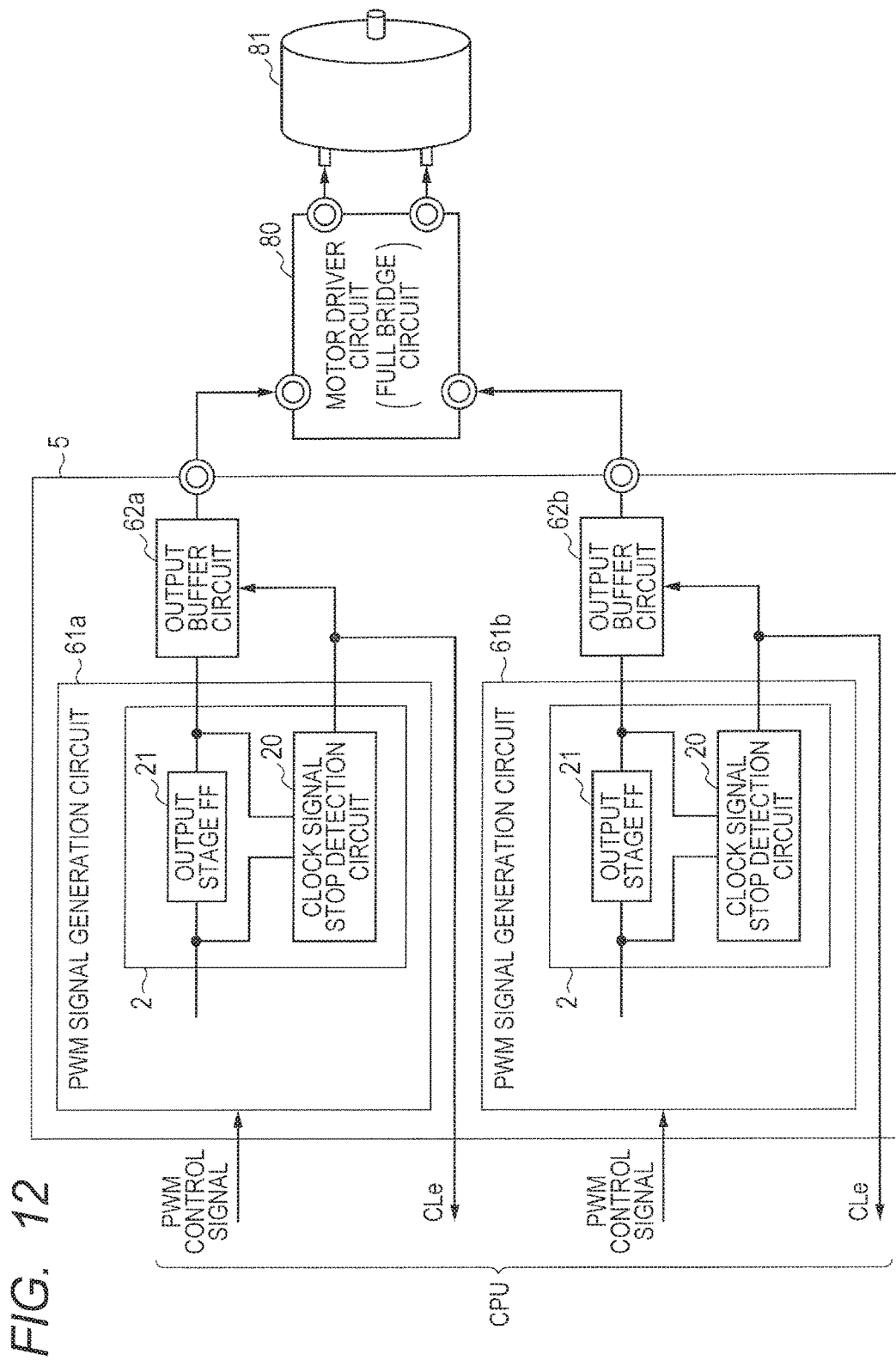
FIG. 12 is a block diagram illustrating one example of a semiconductor device according to a fourth embodiment

In the embodiment 4, one example that the PWM signal used for generation of a drive signal is generated in a motor driver circuit 80 by using the plurality of PWM signal generation circuits described in the second embodiment will be described. Thus, FIG. 12 is a block diagram illustrating one example of a semiconductor device 5 according to the fourth embodiment. Incidentally, in the description of the fourth embodiment, the same numerals as those in the first and second embodiments are assigned to the same constitutional elements as those in the first and second embodiments and description thereon is omitted.

As illustrated in FIG. 12, the semiconductor device 5 according to the fourth embodiment includes two sets of the PWM signal generation circuits 61 and the output buffer circuits 62. In the example illustrated in FIG. 12, in order to mutually distinguish the PWM signal generation circuits and the output buffer circuits, the same alphabet is added to the ends of the numerals of the blocks belonging to the same set. In the semiconductor device 5 according to the fourth embodiment, PWM signal generation circuits 61a and 61b output PWM signals of different phases and thereby drive the motor driver circuit 80. Then, the motor driver circuit 80 outputs the drive signal for rotating a motor 81 on the basis of the input PWM signals.

In the above-mentioned semiconductor device 5 according to the fourth embodiment, the motor 81 is rotated by controlling such that the PWM signals output from the PWM signal generation circuits 61a and 61b are alternately switched to the high level. On the other hand, in the semiconductor device 5 according to the fourth embodiment, the brake is applied to the motor 81 by simultaneously switching the PWM signals output from the PWM signal generation circuits 61a and 61b to the high levels. In the semiconductor device 5 according to the fourth embodiment, the motor 81 is brought to a stop by controlling such that the PWM signals output from the PWM signal generation circuits 61a and 61b are simultaneously switched to the low levels.

Here, in the semiconductor device 5 according to the fourth embodiment, when occurrence of the error has been notified from the clock signal stop detection circuits 20 of the PWM signal generation circuits 61a and 61b, it is possible to immediately bring the motor 81 to a stop by forcibly controlling outputs from output buffers 62a and 62b with the clock signal stop detection signal CLe. Thereby, in the semiconductor device 5 according to the fourth embodiment, it becomes possible to avoid unintended rotation of the motor 81 caused by the abnormality of the clock signal in the semiconductor device 5. In addition, in the semiconductor device 5 according to the fourth embodiment, the clock signal stop detection signal CLe is also supplied to the CPU and so forth for notification of the abnormality. Therefore, even when the malfunction has occurred in one of the PWM signal generation circuits 61a and 61b, it is possible to make the normally operated PWM signal generation circuit 61a or 61b perform the operation to be performed in occurrence of the malfunction.

Although in the foregoing, the invention that has been made by the inventors and others has been specifically described on the basis of the preferred embodiments of the present invention, it goes without saying that the present invention is not limited to the above-mentioned embodiments and may be altered and modified in a variety of ways within the range not deviating from the gist of the present invention.

What is claimed is:

1. A semiconductor device, comprising:
an edge detection circuit that detects an edge of input data;
a first counter that is reset with a clock signal used to fetch the input data in a data retention circuit and counts an edge detection frequency of the edge detection circuit;
a second counter that is reset with an inverted clock signal that is inverted from the clock signal and counts the edge detection frequency of the edge detection circuit, and
a clock signal stop decision circuit that outputs a clock signal stop detection signal in accordance with a situation that one of the first counter and the second counter has reached an overflow state.

2. The semiconductor device according to claim 1,
wherein the second counter is larger by about 3 or more than the first counter in count value with which the second counter reaches the overflow state.

3. The semiconductor device according to claim 1,
wherein the edge detection circuit detects the edge of the input data in accordance with occurrence of a difference in logical level between signals at input and output terminals of the data retention circuit.

4. The semiconductor device according to claim 1,
wherein when the count value has reached a value that causes the overflow state, the first counter and the second counter each retains the logical level of the clock signal stop detection signal until supply of the clock signal is resumed.

5. The semiconductor device according to claim 1,
wherein the first counter includes
a first gating circuit that allows passage of an input edge detection signal that the edge detection circuit outputs in a time period that the clock signal is at a first logical level,
a first set/reset flip-flop that resets a first output to the first logical level with the clock signal that is at a second logical level that is reverse to the first logical level and sets the first output to the second logical level in accordance with a situation that a second output from the first gating circuit has shifted to the second logical level,
a second gating circuit that outputs a third output to a first rear-stage circuit, where the third output is the first output from the first set/reset flip-flop in a time period that an inverted input edge detection signal that has been inverted from the input edge detection signal is at the second logical level, and
a second set/reset flip-flop that sets a fourth output to the second logical level in accordance with a situation that the third output from the second gating circuit has shifted to the second logic level and resets the fourth output to the first logical level in accordance with a situation that the clock signal has shifted to the second logical level, and
wherein the second counter includes
a third gating circuit that allows passage of the input edge detection signal that the edge detection circuit outputs in a time period that the clock signal is at the second logical level,
a third set/reset flip-flop that resets a fifth output to the first logical level with the clock signal that is at the first logical level and sets the fifth output to the second logical level in accordance with a situation that a sixth output from the third gating circuit has shifted to the second logical level, a fourth gating circuit that outputs a seventh output to a second rear-stage circuit, where the seventh output is the fifth output from the third set/reset flip-flop in a time period that the inverted input edge detection signal is at the second logical level, a weight counter that starts a counting operation in accordance with a situation that the seventh output from the fourth gating circuit has shifted to the second logic level, increments a count value in accordance with an edge of the seventh output from the fourth gating circuit, and resets the count value in accordance with a situation that the clock signal has shifted to the first logical level, and a fourth set/reset flip-flop that sets an eighth output to the second logical level in accordance with a situation that a ninth output from a final stage of the weight counter has shifted to the second logical level and resets the eighth output to the first logical level in accordance with a situation that the clock signal has shifted to the first logical level.

6. The semiconductor device according to claim 5, wherein the weight counter includes first toggle flip-flops each of which is reset with the clock signal that is at the first logical level and sets an output to the logical level of a signal to be input in accordance with the inverted input edge detection signal that is at the second logical level, and a second toggle flip-flop that is reset with the clock signal that is at the first logical level and sets an output to the logical level of a signal to be input in accordance with the inverted input edge detection signal that is at the first logical level, and wherein one and the other of the first toggle flip-flops are alternately coupled in series with the second toggle flip-flop and an output terminal of the final stage is loop-coupled to an input terminal of a first stage.

7. The semiconductor device according to claim 1, further comprising:

the data retention circuit, wherein:

a register is configured by the data retention circuit, and the edge detection circuit, the first counter, the second counter, and the clock signal stop decision circuit detect a stop of the clock signal on the basis of input data in the data retention circuit and the clock signal that is input into the data retention circuit.

8. The semiconductor device according to claim 1, further comprising:

the data retention circuit, wherein:

a PWM signal is output from the data retention circuit to a rear-stage circuit, and the edge detection circuit, the first counter, the second counter, and the clock signal stop decision circuit detect a stop of the clock signal on the basis of input data in the data retention circuit and the clock signal that is input into the data retention circuit.

9. The semiconductor device according to claim 1, wherein the data retention circuit is a D flip-flop that retains a value of the input data in synchronization with the clock signal.

10. A semiconductor device comprising:

a main clock signal wiring that transmits a first clock signal;

a clock signal monitor circuit that detects an abnormality of the first clock signal;

a sub clock signal wiring that transmits a second clock signal used for an operation of the clock signal monitor circuit;

a clock signal distribution network that apportions the first clock signal to a plurality of circuits as synchronous clock signals;

a data retention circuit that retains a value of input data on the basis of the synchronous clock signals; and a clock signal stop detection circuit that detects a stop of the synchronous clock signal to be given to the data retention circuit on the basis of the input data, wherein the clock signal stop detection circuit includes an edge detection circuit that detects an edge of the input data, a first counter that is reset with the synchronous clock signal input into the data retention circuit and counts an edge detection frequency of the edge detection circuit, a second counter that is reset with an inverted synchronous clock signal that is inverted from the synchronous clock signal and counts the edge detection frequency of the edge detection circuit, and a clock signal stop decision circuit that outputs a clock signal stop signal in accordance with a situation that one of the first counter and the second counter has reached an overflow state.

* * * * *